United States Patent
Lim et al.

(10) Patent No.: US 11,495,514 B2
(45) Date of Patent: Nov. 8, 2022

(54) BATHTUB INTEGRATED HEAT SPREADER WITH MULTIPLE THERMAL-INTERFACE MATERIAL FOR INTEGRATED-CIRCUIT PACKAGES

(71) Applicant: Intel Corporation, Santa Clara, CA (US)

(72) Inventors: Chew Ching Lim, Bayan Lepas (MY); Chun Howe Sim, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 117 days.

(21) Appl. No.: 17/025,899

(22) Filed: Sep. 18, 2020

(65) Prior Publication Data

US 2021/0183727 A1 Jun. 17, 2021

(30) Foreign Application Priority Data

Dec. 11, 2019 (MY) ............................ PI2019007403

(51) Int. Cl.
*H01L 23/367* (2006.01)
*H01L 23/40* (2006.01)

(52) U.S. Cl.
CPC .......... *H01L 23/3675* (2013.01); *H01L 23/40* (2013.01)

(58) Field of Classification Search
CPC ... H01L 23/36; H01L 23/367; H01L 23/3675; H01L 23/40; H01L 23/42; H01L 23/4882
See application file for complete search history.

(56) References Cited

U.S. PATENT DOCUMENTS

| | | | |
|---|---|---|---|
| 2008/0157345 A1* | 7/2008 | Lu | H01L 23/42 |
| | | | 438/122 |
| 2017/0188448 A1* | 6/2017 | Liang | H05K 1/0203 |
| 2019/0043777 A1* | 2/2019 | Hyung | H01L 23/42 |
| 2019/0390926 A1* | 12/2019 | Koyano | H01L 23/373 |

\* cited by examiner

*Primary Examiner* — Allan R Wilson

(74) *Attorney, Agent, or Firm* — Schwegman Lundberg & Woessner, P.A.

(57) ABSTRACT

Disclosed embodiments include multiple thermal-interface material at the interface between an integrated heat spreader and a heat sink. A primary thermal-interface material has flow qualities and a secondary thermal-interface material has containment and adhesive qualities. The integrated heat spreader has a basin form factor that contains the primary thermal-interface material.

19 Claims, 4 Drawing Sheets

BATHTUB INTEGRATED HEAT SPREADER WITH MULTIPLE THERMAL-INTERFACE MATERIAL FOR INTEGRATED-CIRCUIT PACKAGES

PRIORITY APPLICATION

This application claims the benefit of priority to Malaysian Application Serial Number PI2019007403, filed Dec. 11, 2019, which is incorporated herein by reference in its entirety.

FIELD

This disclosure relates to enabling heat-management solutions for integrated-circuit device packages.

BACKGROUND

Heat-management solutions have individual challenges where different qualities are not as useful in one circumstance as in a different one.

BRIEF DESCRIPTION OF THE DRAWINGS

Disclosed embodiments are illustrated by way of example, and not by way of limitation, in the figures of the accompanying drawings where like reference numerals may refer to similar elements, in which.

DETAILED DESCRIPTION

Disclosed embodiments depict a multiple thermal-interface system that is between a heat spreader and a heat sink. Disclosed embodiments include a basin form-factor integrated heat spreader, where the basin form factor is at the secondary thermal-interface or TIM2 location. For example, an integrated heat-spreader embodiment may be an integrated heat spreader (IHS) which is also referred to as a lid.

In an embodiment, the multiple-thermal-interface system is referred to a second thermal-interface material or TIM2, where a first thermal-interface system is between an integrated-circuit die and the heat spreader, which system is referred to as TIM1.

Disclosed embodiments address maintaining a coherent TIM2 interface during thermal warpage under field-use conditions. Disclosed embodiments demonstrate coherent TIM2 contacts while power demand in computational cycles and power-on, power-off thermal cycling, experience warpage of the integrated-circuit die and the interaction between TIM1 and TIM2, as well as heat flux into an integrated-circuit package substrate that seats the IC die.

Figure 1A:
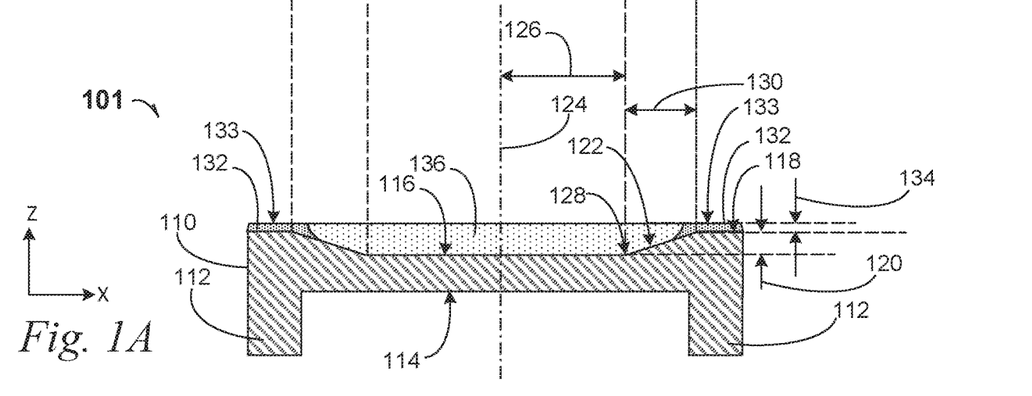
FIG. 1A is a cross-section elevation of bathtub integrated heat spreader according to several embodiments.

FIG. 1A is a cross-section elevation of bathtub integrated heat spreader, which may also be referred to as a TIM2-basin integrated heat spreader (TIM2 basin IHS). An IHS body 110 includes legs 112 and a TIM1 interface 114 according to an embodiment.

At a TIM2 interface 116 that is opposite the TIM1 interface 114, a basin form factor is seen where the reference arrow 116 touches a basin floor 116. The basin form factor is also described at a basin shoulder 118 that defines a basin height 120 from the basin floor 116.

In an embodiment, the basin form factor is further defined by a sidewall 122 that connects the basin floor 116 to the basin shoulder 118. The basin form factor is further defined by a basin symmetry line 124 and a distance 126 to an inflection point 128 of the sidewall 122 at the basin floor 116. The pitch of the sidewall 122 is defined by a length 130 from the inflection point 128 to the shoulder 118, and by the basin height 120.

The basin form factor is further formed by a thermal adhesive 132, which creates a thermal-adhesive height 134 from the basin shoulder 118. The thermal-adhesive height 134 is defined in part by a thermal-adhesive top surface 133 above the basin shoulder 118.

In an embodiment, a primary thermal-interface material 136 occupies the basin form factor, including from the basin floor 116 to the top of the thermal adhesive 132, and continuously from the basin floor 116, along the basin sidewall 122.

In an embodiment, the primary thermal-interface material (primary TIM2) 136 is a thermal grease. In an embodiment, the primary TIM2 136 is a pliable polymer that has viscosity inversely proportional to temperature. The secondary TIM (secondary TIM2) 132 contains the primary TIM2 within the basin form factor of the bathtub IHS 110.

In an embodiment, basin height 120 is in a range from 0.02 millimeter (mm) to 0.05 mm. In an embodiment, the thermal adhesive 132, also referred to as the secondary TIM2 132 has a thickness in a range from 0.01 mm to 0.05 mm. In an embodiment, the secondary TIM2 132 has thickness of 0.03 mm. In an embodiment, the composite height 120, 134 to occupy the primary TIM2 136, is 0.08 mm. In an embodiment, the composite height 120, 134 to occupy the primary TIM2 136 is greater than 0.05, for example 0.06 mm or more, depending upon bonding pressure and specific application utility.

In an embodiment similar to the illustrated slanted sidewall 122, the secondary thermal-interface material 132 has a slanted sidewall that begins on the IHS sidewall 122 and reaches the thermal-adhesive height 132 at the top 133, above the shoulder 118 of the IHS 110.

During assembly of a heat sink (see item 250 in FIG. 2), the primary TIM2 136 is made to contact the center of the heat sink 250 under flexure, and pressure attachment to the secondary TIM2 132, allows the primary TIM2 136 to flow along the basin floor the floor 116, along the sidewall 122, and along the slanted portion of the secondary TIM2 132, to substantially preclude gas entrainment.

Figure 1B:
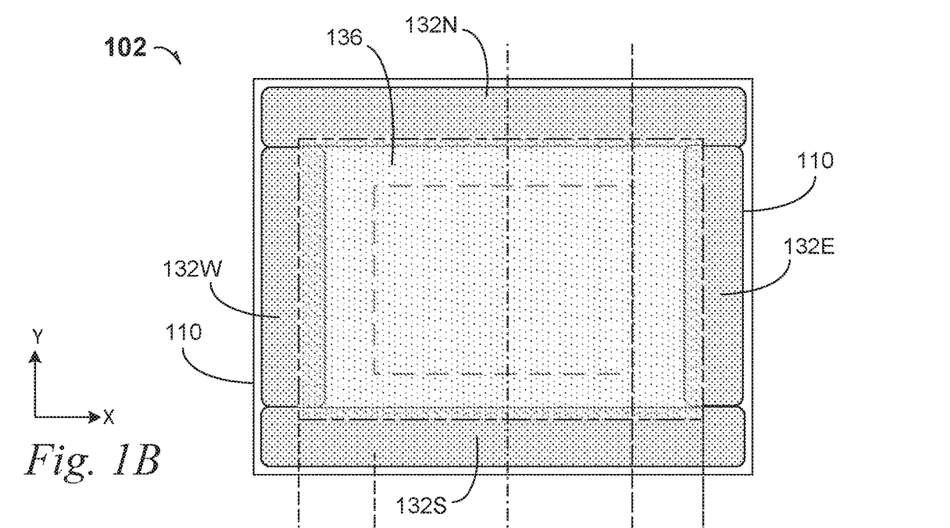
FIG. 1B is a top plan of the bathtub integrated heat sink depicted in FIG. 1A according to several embodiments.

FIG. 1B is a top plan 102 of the bath tub integrated heat sink 101 depicted in FIG. 1A according to several embodiments. The integrated heat spreader 110 is defined in part by the primary TIM2 136 as it is within a containment form factor of the secondary TIM2 132. In an embodiment, the secondary thermal-interface material 132 includes a plurality of sections, such as four sections that are seated on the bathtub integrated heat spreader shoulder 118 (see FIG. 1A), including a north secondary TIM2 132N, south secondary TIM2 132S, east secondary TIM2 132E and a west secondary TIM2 132W.

Figure 2:
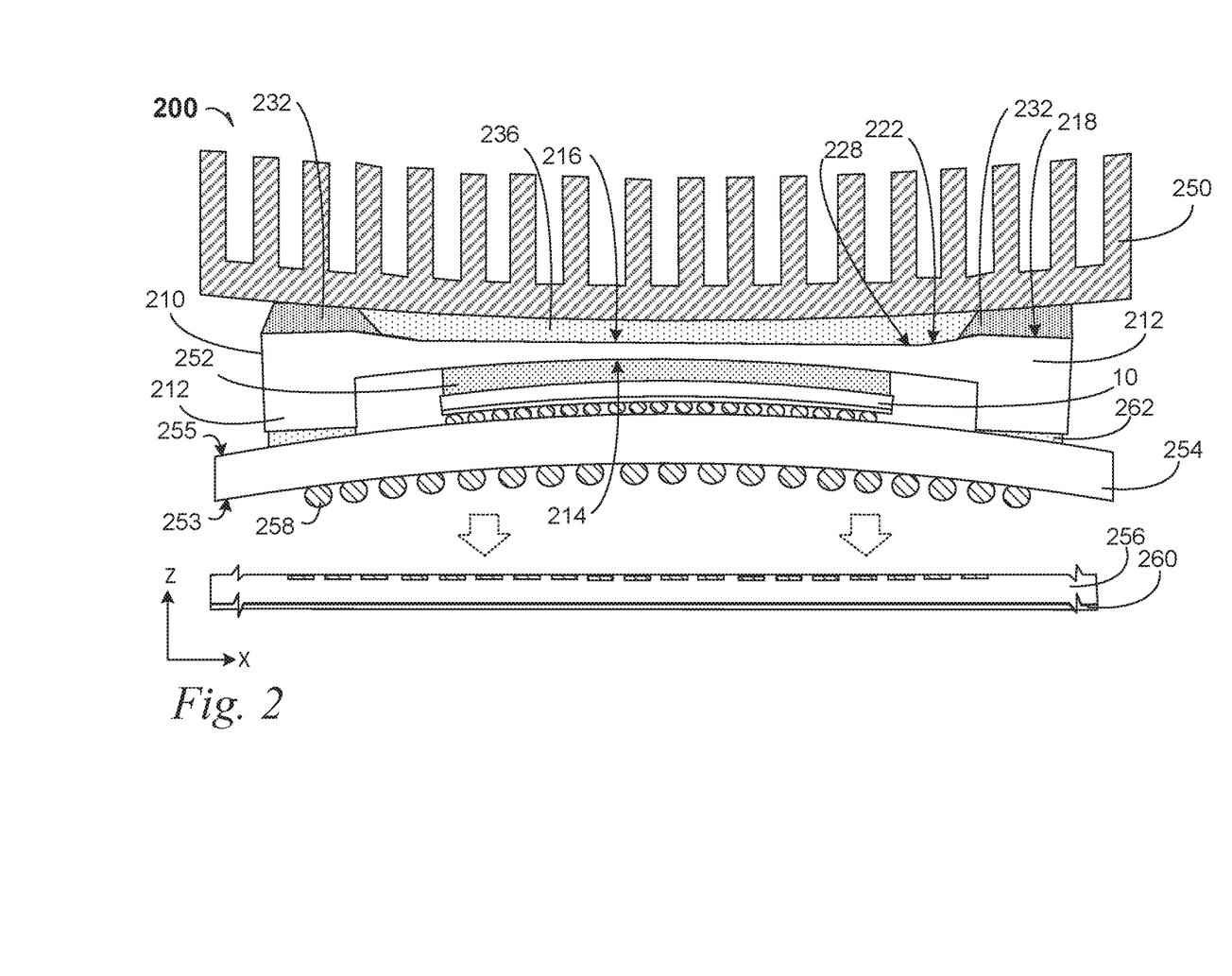
FIG. 2 is a cross-section elevation of an integrated-circuit device package with a bathtub integrated heat spreader heat-transfer solution according to several embodiments.

FIG. 2 is a cross-section elevation of an integrated-circuit device package 200 with a bathtub integrated heat spreader, heat-transfer solution according to several embodiments. A bathtub IHS body 210 includes legs 212 and a TIM1 interface 214 that is between a first integrated-circuit die 10 and the bathtub IHS 210 according to an embodiment. As illustrated, the bathtub IHS body 210 is under exaggerated flexure caused by a heat load that originates from a first integrated die 10 according to an embodiment.

At a TIM2 interface 216 that is opposite the TIM1 interface 214, a basin form factor is seen where the reference arrow 216 touches a basin floor 216. The basin form factor is also described at a basin shoulder 218 that defines a basin height from the basin floor 116.

In an embodiment, the basin form factor is further defined by a sidewall 222 that connects at an inflection point 228, between the basin floor 216 to the basin shoulder 218. The pitch of the sidewall 222 is defined by a length from the inflection point 228 to the shoulder 218, and by the basin height at the basin shoulder 218.

The basin form factor is further formed by a thermal adhesive 232, which creates a thermal-adhesive height from the basin shoulder 218.

In an embodiment, a primary thermal-interface material (primary TIM2) 236 occupies the basin form factor, including from the basin floor 216 to the top of the thermal adhesive 232 (secondary TIM2 232), and continuously from the basin floor 216, along the basin sidewall 222.

In an embodiment, the primary TIM2 236 is a fluid such as a thermal grease. In an embodiment, the primary TIM2 236 is a pliable polymer that has viscosity inversely proportional to temperature.

In an embodiment similar to the illustrated slanted sidewall 222, the secondary thermal-interface material 232 has a slanted sidewall that begins on the IHS sidewall 222 and extends to the top of the thermal-adhesive 232, above the shoulder 218 of the IHS 210.

During assembly of a heat sink 250, the primary TIM2 236 is made to contact the center of the heat sink 250 under flexure, and pressure attachment to the secondary TIM2 232, allows the primary TIM2 236 to flow along the basin floor 216, along the sidewall 222, and along the slanted portion of the secondary TIM2 232, to substantially preclude gas entrainment.

After seating the secondary TIM2 232 onto a heat sink 250, curing is done by thermal changing the adhesive character of the secondary TIM2 232. An example of a heat sink is a finned heat sink 250 that contacts the heat spreader. Another example of a heat sink is a heat pipe that contacts the heat spreader. Another example of a heat sink is a heat slug. In an embodiment, a thermal thermal-interface material (TIM1) 262, creates a thermal contact between the first IC die 10 and the TIM1 interface 214 of the bathtub integrated heat spreader 210.

As illustrated, an integrated-circuit package substrate 254 is also under thermal stress from the first IC die 10. The first IC die 10 is seated on a die side 255 of the IC package substrate 254. As illustrated, assembly of the IC package substrate 254, may be accomplished by seating the IC package substrate 254 onto a board 256 such as a motherboard 256. Lack of thermal flexure is not illustrated during seating operations onto the board 256.

In an embodiment, the first integrated-circuit die 10 is part of a multiple-core logic processor such as that manufactured by Intel Corporation of Santa Clara, Calif. In an embodiment at least one subsequent IC die (not illustrated) makes contact between the die side 255 and the TIM1 interface 214, such as through a subsequent IC die backside surface and a subsequent TIM1.

In an embodiment, electrical bumps 258 on a land side 253 of the IC package substrate 254, provide contact between the printed wiring board 256 and the IC package substrate 254. In an embodiment, the board 256 has an external shell 260 such as the exterior of a computing platform. In an embodiment, the external shell 260 is an integral portion of a printed wiring board 256.

Adhesion between the integrated heat spreader 210 and the IC package substrate 254, is accomplished by a heat-spreader adhesive 262.

Figure 3:
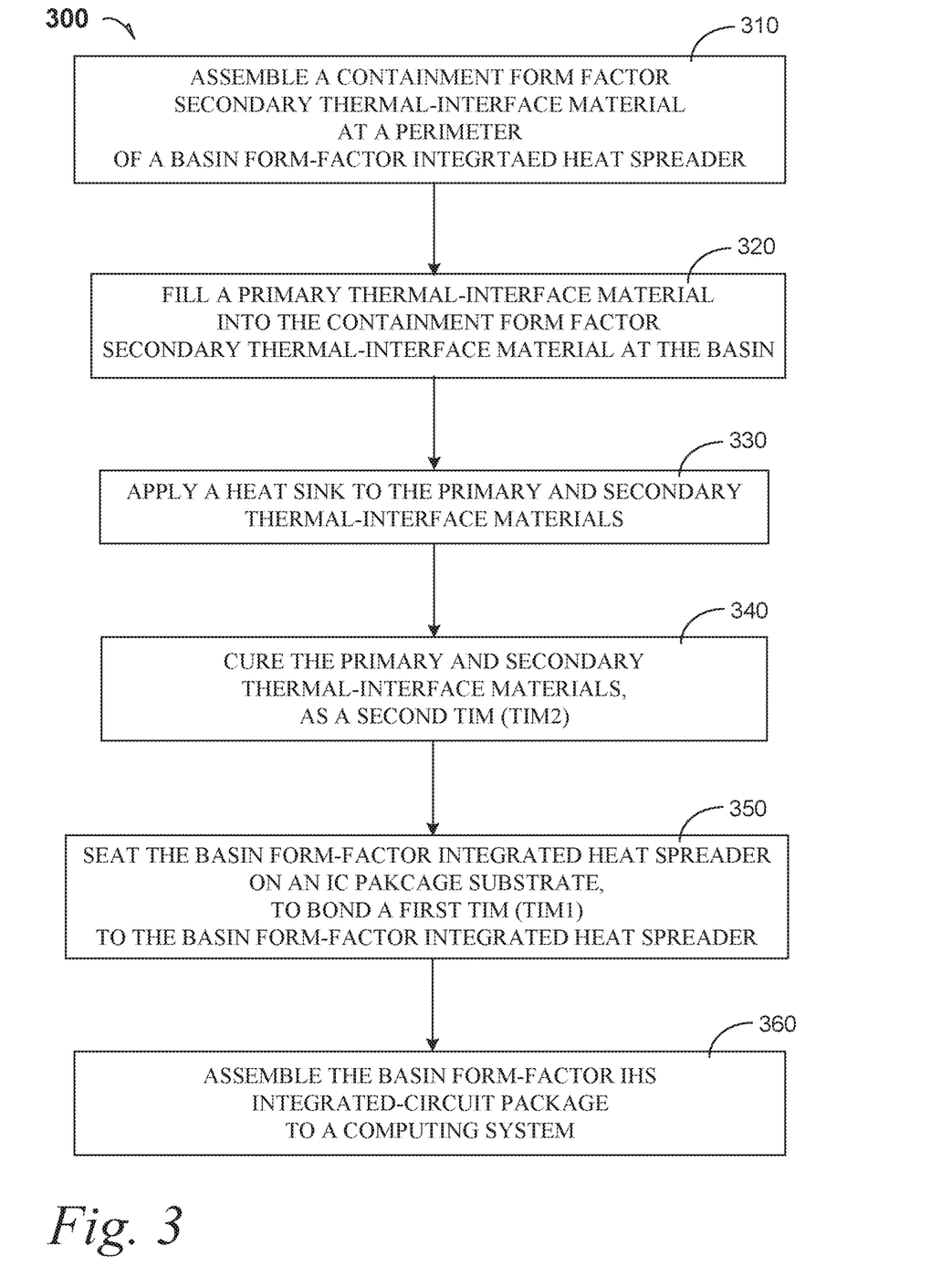
FIG. 3 is a process flow diagram 300 according to several embodiments.

FIG. 3 is a process flow diagram 300 according to several embodiments.

At 310, the process includes assembling a containment form factor, secondary thermal-interface material at a perimeter of a basin form-factor integrated heat spreader. For example, a secondary TIM2 132 is seated at a shoulder 118.

At 320, the process includes filling a primary thermal-interface material into the containment form factor, secondary thermal-interface material at the basin. For example, a primary TIM2 136 thermal grease 136 is filled into the basin form factor to also contact the secondary TIM2 132.

At 330, the process incudes applying a heat sink to the primary TIM2 and secondary TIM2, thermal-interface materials.

At 340, the process includes curing the primary and secondary thermal-interface materials as a second thermal-interface material (TIM2).

At 350, the process includes seating the basin form-factor integrated heat spreader on an integrated-circuit package substrate, to bond a first thermal interface material (TIM1) to the basin form-factor integrated heat spreader. The integrated-circuit package includes an IC die such as the IC die 10 as depicted in FIG. 2, that is bonded to the TIM1 252.

At 360, the process includes assembling the basin form-factor integrated heat spreader, integrated-circuit package to a computing system. For example, the IHS 250 contacts the TIM2 236 and 232, the first IC die 10 contacts the bathtub integrated heat spreader 210, and the IC package substrate contacts both the first IC die 10 and the bathtub integrated heat spreader 210.

Figure 4:
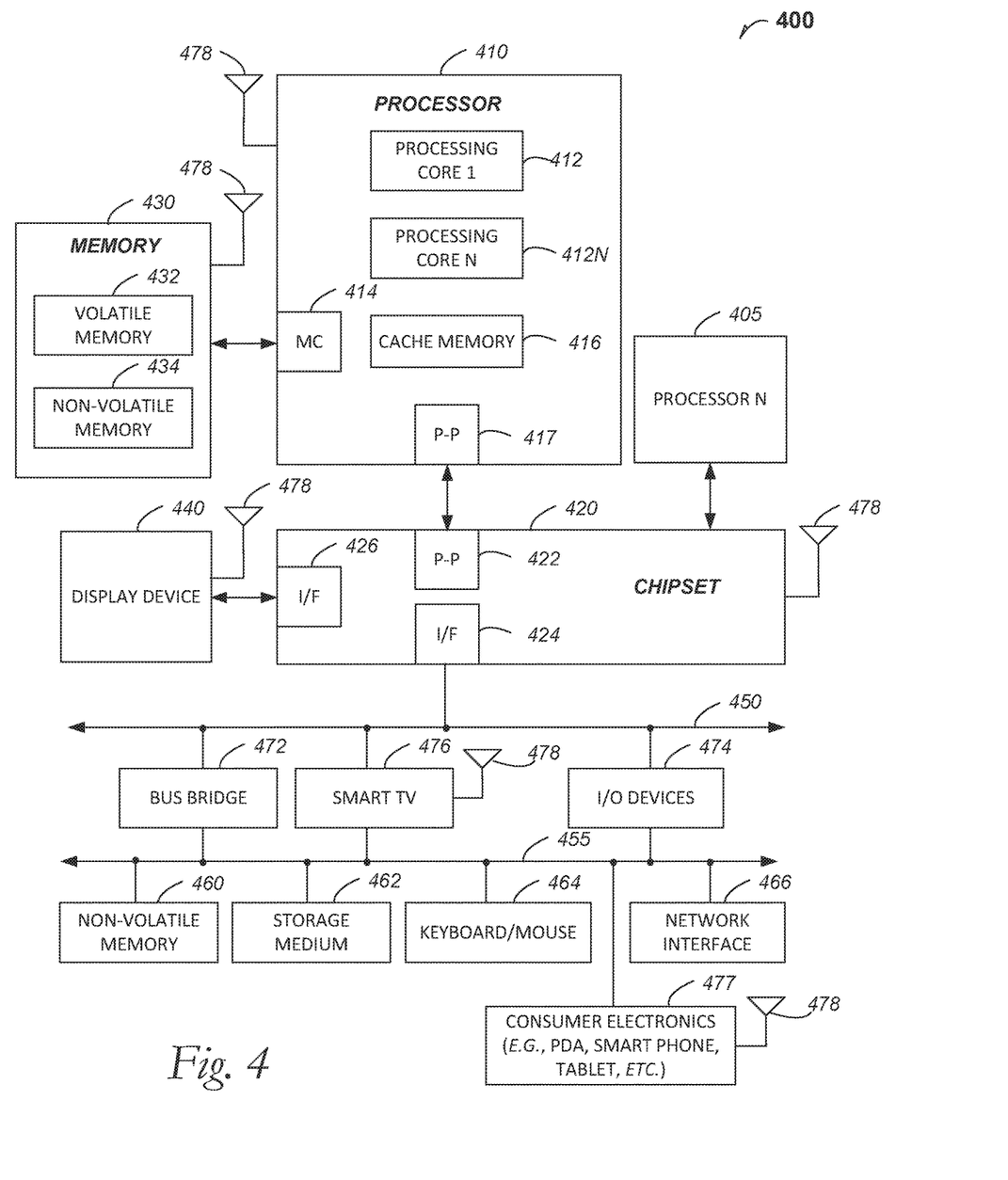
FIG. 4 is included to show an example of a higher-level device application for the disclosed embodiments.

FIG. 4 is included to show an example of a higher-level device application for the disclosed embodiments. The bathtub integrated heat spreader embodiments may be found in several parts of a computing system. In an embodiment, the bathtub heat spreader embodiments can be part of a communications apparatus such as is affixed to a cellular communications tower. In an embodiment, a computing system 400 includes, but is not limited to, a desktop computer. In an embodiment, a computing system 400 includes, but is not limited to a laptop computer. In an embodiment, a computing system 400 includes, but is not limited to a tablet. In an embodiment, a computing system 400 includes, but is not limited to a notebook computer. In an embodiment, a computing system 400 includes, but is not limited to a personal digital assistant (PDA). In an embodiment, a computing system 400 includes, but is not limited to a server. In an embodiment, a computing system 400 includes, but is not limited to a workstation. In an embodiment, a computing system 400 includes, but is not limited to a cellular telephone. In an embodiment, a computing system 400 includes, but is not limited to a mobile computing device. In an embodiment, a computing system 400 includes, but is not limited to a smart phone. In an embodiment, a system 400 includes, but is not limited to an internet appliance. In an embodiment, the computing system 400 is a drone. Other types of computing devices may be configured with the microelectronic device that includes bathtub heat spreader embodiments.

In an embodiment, the processor 410 has one or more processing cores 412 and 412N, where 412N represents the Nth processor core inside processor 410 where N is a positive integer. In an embodiment, the electronic device system 400 using a bathtub heat spreader embodiment that includes multiple processors including 410 and 405, where the processor 405 has logic similar or identical to the logic of the processor 410. In an embodiment, the processing core 412 includes, but is not limited to, pre-fetch logic to fetch instructions, decode logic to decode the instructions, execution logic to execute instructions and the like. In an embodiment, the processor 410 has a cache memory 416 to cache at least one of instructions and data for the bathtub heat spreader on an integrated-circuit package substrate in the system 400. The cache memory 416 may be organized into a hierarchal structure including one or more levels of cache memory.

In an embodiment, the processor 410 includes a memory controller 414, which is operable to perform functions that enable the processor 410 to access and communicate with memory 430 that includes at least one of a volatile memory 432 and a non-volatile memory 434. In an embodiment, the processor 410 is coupled with memory 430 and chipset 420. In an embodiment, the chipset 420 is part of a bathtub heat spreader embodiment depicted, e.g. in FIG. 2.

The processor 410 may also be coupled to a wireless antenna 478 to communicate with any device configured to at least one of transmit and receive wireless signals. In an embodiment, the wireless antenna interface 478 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 432 includes, but is not limited to, Synchronous Dynamic Random-Access Memory (SDRAM), Dynamic Random-Access Memory (DRAM), RAMBUS Dynamic Random-Access Memory (RDRAM), and/or any other type of random access memory device. The non-volatile memory 434 includes, but is not limited to, flash memory, phase change memory (PCM), read-only memory (ROM), electrically erasable programmable read-only memory (EEPROM), or any other type of non-volatile memory device.

The memory 430 stores information and instructions to be executed by the processor 410. In an embodiment, the memory 430 may also store temporary variables or other intermediate information while the processor 410 is executing instructions. In the illustrated embodiment, the chipset 420 connects with processor 410 via Point-to-Point (PtP or P-P) interfaces 417 and 422. Either of these PtP embodiments may be achieved using a bathtub heat spreader embodiment as set forth in this disclosure. The chipset 420 enables the processor 410 to connect to other elements in a bathtub heat spreader embodiment in a system 400. In an embodiment, interfaces 417 and 422 operate in accordance with a PtP communication protocol such as the Intel® QuickPath Interconnect (QPI) or the like. In other embodiments, a different interconnect may be used.

In an embodiment, the chipset 420 is operable to communicate with the processor 410, 405N, the display device 440, and other devices 472, 476, 474, 460, 462, 464, 466, 477, etc. The chipset 420 may also be coupled to a wireless antenna 478 to communicate with any device configured to at least do one of transmit and receive wireless signals.

The chipset 420 connects to the display device 440 via the interface 426. The display 440 may be, for example, a liquid crystal display (LCD), a plasma display, cathode ray tube (CRT) display, or any other form of visual display device. In an embodiment, the processor 410 and the chipset 420 are merged into a bathtub heat spreader embodiment in a system. Additionally, the chipset 420 connects to one or more buses 450 and 455 that interconnect various elements 474, 460, 462, 464, and 466. Buses 450 and 455 may be interconnected together via a bus bridge 472 such as at least one bathtub heat spreader embodiment. In an embodiment, the chipset 420, via interface 424, couples with a non-volatile memory 460, a mass storage device(s) 462, a keyboard/mouse 464, a network interface 466, smart TV 476, and the consumer electronics 477, etc.

In an embodiment, the mass storage device 462 includes, but is not limited to, a solid-state drive, a hard disk drive, a universal serial bus flash memory drive, or any other form of computer data storage medium. In one embodiment, the network interface 466 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 4 are depicted as separate blocks within the bathtub heat spreader embodiments in a computing system 400, the functions performed by some of these blocks may be integrated within a single semiconductor circuit or may be implemented using two or more separate integrated circuits. For example, although cache memory 416 is depicted as a separate block within processor 410, cache memory 416 (or selected aspects of 416) can be incorporated into the processor core 412.

To illustrate the bathtub heat spreader IC package embodiments and methods disclosed herein, a non-limiting list of examples is provided herein:

Example 1 is an integrated heat spreader, comprising: a basin form factor at a heat-sink interface; a primary thermal-interface material in the basin form factor; and a containment form factor secondary thermal-interface material at a perimeter of the basin form factor.

In Example 2, the subject matter of Example 1 optionally includes wherein the basin form factor includes: a basin floor opposite a first thermal-interface material interface (TIM1 interface); a basin sidewall; a basin shoulder wherein the basin wall connects the basin floor to the basin shoulder at an inflection point at the basin floor and the sidewall; and wherein the containment form factor secondary thermal-interface material contacts the basin shoulder.

In Example 3, the subject matter of any one or more of Examples 1-2 optionally include wherein the basin form factor includes: a basin floor opposite a first thermal-interface material interface (TIM1 interface); a basin sidewall; a basin shoulder wherein the basin wall connects the basin floor to the basin shoulder at an inflection point at the basin floor and the sidewall; wherein the containment form factor secondary thermal-interface material contacts the basin shoulder; and wherein the containment form factor secondary thermal-interface material includes a slanted surface that contacts the sidewall.

In Example 4, the subject matter of any one or more of Examples 1-3 optionally include wherein the containment form factor secondary thermal-interface material includes a plurality of sections on the basin shoulder.

In Example 5, the subject matter of any one or more of Examples 1-4 optionally include wherein the primary thermal-interface material in the basin form factor is a fluid.

In Example 6, the subject matter of any one or more of Examples 1-5 optionally include wherein the secondary thermal-interface material is a thermal adhesive.

In Example 7, the subject matter of any one or more of Examples 1-6 optionally include wherein the primary thermal-interface material in the basin form factor is a fluid, and wherein the secondary thermal-interface material is a thermal adhesive.

In Example 8, the subject matter of any one or more of Examples 1-7 optionally include wherein the primary thermal-interface material in the basin form factor is a thermal grease, and wherein the secondary thermal-interface material is a thermal adhesive.

In Example 9, the subject matter of any one or more of Examples 1-8 optionally include wherein the basin form factor includes: a basin floor opposite a first thermal-interface material interface (TIM1 interface); a basin sidewall; a basin shoulder wherein the basin wall connects the basin floor to the basin shoulder at an inflection point at the basin floor and the sidewall; wherein the containment form factor secondary thermal-interface material contacts the basin shoulder; wherein the primary thermal-interface material in the basin form factor is a thermal grease, and wherein the secondary thermal-interface material is a thermal adhesive; and wherein the primary thermal-interface material fills from the basin floor to the secondary thermal-interface material at a thermal-adhesive top surface above the basin shoulder.

In Example 10, the subject matter of any one or more of Examples 1-9 optionally include wherein the basin form factor includes: a basin floor opposite a first thermal-interface material interface (TIM1 interface); a basin sidewall; a basin shoulder wherein the basin wall connects the basin floor to the basin shoulder at an inflection point at the basin floor and the sidewall; wherein the containment form factor secondary thermal-interface material contacts the basin shoulder; wherein the primary thermal-interface material in the basin form factor is a thermal grease, and wherein the secondary thermal-interface material is a thermal adhesive; and wherein the primary thermal-interface material fills from the basin floor to the secondary thermal-interface material at a thermal-adhesive top surface above the basin shoulder, to a height in a range from in a range from 0.02 mm to 0.08 mm.

Example 11 is an integrated-circuit device package, comprising: an integrated-circuit die including a die backside surface; a first thermal interface material (TIM1) on the die backside surface; an integrated heat spreader contacting the TIM1 at a TIM1 interface, wherein the integrated heat spreader includes: a basin form factor at a heat-sink interface that is opposite the TIM1 interface; a primary thermal-interface material (primary TIM2) in the basin form factor; and a containment form factor secondary thermal-interface material (secondary TIM2) at a perimeter of the basin form factor, wherein the primary TIM2 fills and contacts secondary TIM2.

In Example 12, the subject matter of Example 11 optionally includes a heat sink on the secondary TIM2 and in contact with the primary TIM2.

In Example 13, the subject matter of any one or more of Examples 11-12 optionally include wherein the basin form factor includes: a basin floor opposite the TIM1 interface; a basin sidewall; a basin shoulder wherein the basin wall connects the basin floor to the basin shoulder at an inflection point at the basin floor and the sidewall; wherein the containment form factor secondary thermal-interface material contacts the basin shoulder; wherein the primary thermal-interface material in the basin form factor is a thermal grease, and wherein the secondary thermal-interface material is a thermal adhesive; and wherein the primary thermal-interface material fills from the basin floor to the secondary thermal-interface material at a thermal-adhesive top surface above the basin shoulder.

In Example 14, the subject matter of any one or more of Examples 11-13 optionally include wherein the basin form factor includes: a basin floor opposite the TIM1 interface; a basin sidewall; a basin shoulder wherein the basin wall connects the basin floor to the basin shoulder at an inflection point at the basin floor and the sidewall; wherein the containment form factor secondary thermal-interface material contacts the basin shoulder; wherein the primary thermal-interface material in the basin form factor is a thermal grease, and wherein the secondary thermal-interface material is a thermal adhesive; wherein the primary thermal-interface material fills from the basin floor to the secondary thermal-interface material at a thermal-adhesive top surface above the basin shoulder; and a heat sink on the secondary TIM2 and in contact with the primary TIM2.

In Example 15, the subject matter of any one or more of Examples 11-14 optionally include a board on the basin form-factor integrated heat spreader; wherein the integrated-circuit die is a first IC die; a chipset on the board; and a memory die on the board.

In Example 16, the subject matter of any one or more of Examples 11-15 optionally include a printed wiring board on the basin form-factor integrated heat spreader; wherein the integrated-circuit die is a first IC die; a chipset on the printed wiring board; a memory die on the printed wiring; and an external shell that is an integral portion of a printed wiring board.

Example 17 is a process of assembling an integrated heat sink, comprising: containing a primary thermal-interface material in a basin form factor on an integrated heat sink, by a containment form-factor secondary thermal-interface material at a perimeter of the integrated heat sink.

In Example 18, the subject matter of Example 17 optionally includes).

In Example 19, the subject matter of any one or more of Examples 17-18 optionally include applying a heat sink to the primary and secondary thermal-interface materials (primary TIM2 and secondary TIM2); and curing the primary TIM2 and secondary TIM2 to form a TIM2.

In Example 20, the subject matter of any one or more of Examples 17-19 optionally include applying a heat sink to the primary and secondary thermal-interface materials (primary TIM2 and secondary TIM2); curing the primary TIM2 and secondary TIM2 to form a TIM2; and seating the basin form-factor integrated heat spreader on an integrated-circuit package substrate, to bond a first thermal interface material (TIM1) at a die backside surface of an integrated-circuit die.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. An integrated heat spreader, comprising:
a basin form factor at a heat-sink interface;
a primary thermal-interface material in the basin form factor; and
a containment form factor secondary thermal-interface material at a perimeter of the basin form factor, wherein the secondary thermal-interface material is a thermal adhesive.

2. The integrated heat spreader of claim 1, wherein the basin form factor includes:
a basin floor opposite a first thermal-interface material interface (TIM1 interface);
a basin sidewall;
a basin shoulder wherein the basin sidewall connects the basin floor to the basin shoulder at an inflection point at the basin floor and the sidewall; and
wherein the containment form factor secondary thermal-interface material contacts the basin shoulder.

3. The integrated heat spreader of claim 1, wherein the basin form factor includes:
a basin floor opposite a first thermal-interface material interface (TIM1 interface);
a basin sidewall;
a basin shoulder wherein the basin sidewall connects the basin floor to the basin shoulder at an inflection point at the basin floor and the sidewall;
wherein the containment form factor secondary thermal-interface material contacts the basin shoulder; and
wherein the containment form factor secondary thermal-interface material includes a slanted surface that contacts the sidewall.

4. The integrated heat spreader of claim 1, wherein the containment form factor secondary thermal-interface material includes a plurality of sections on the basin shoulder.

5. The integrated heat spreader of claim 1, wherein the primary thermal-interface material in the basin form factor is a fluid.

6. The integrated heat spreader of claim 1, wherein the primary thermal-interface material in the basin form factor is a fluid, and wherein the secondary thermal-interface material is a thermal adhesive.

7. The integrated heat spreader of claim 1, wherein the primary thermal-interface material in the basin form factor is a thermal grease, and wherein the secondary thermal-interface material is a thermal adhesive.

8. The integrated heat spreader of claim 1, wherein the basin form factor includes:
a basin floor opposite a first thermal-interface material interface (TIM1 interface);
a basin sidewall;
a basin shoulder wherein the basin wall connects the basin floor to the basin shoulder at an inflection point at the basin floor and the sidewall;
wherein the containment form factor secondary thermal-interface material contacts the basin shoulder;
wherein the primary thermal-interface material in the basin form factor is a thermal grease, and wherein the secondary thermal-interface material is a thermal adhesive; and wherein the primary thermal-interface material fills from the basin floor to the secondary thermal-interface material at a thermal-adhesive top surface above the basin shoulder.

9. The integrated heat spreader of claim 1, wherein the basin form factor includes:
a basin floor opposite a first thermal-interface material interface (TIM1 interface);
a basin sidewall;
a basin shoulder wherein the basin wall connects the basin floor to the basin shoulder at an inflection point at the basin floor and the sidewall;
wherein the containment form factor secondary thermal-interface material contacts the basin shoulder;
wherein the primary thermal-interface material in the basin form factor is a thermal grease, and wherein the secondary thermal-interface material is a thermal adhesive; and
wherein the primary thermal-interface material fills from the basin floor to the secondary thermal-interface material at a thermal-adhesive top surface above the basin shoulder, to a height in a range from 0.02 mm to 0.08 mm.

10. An integrated-circuit device package, comprising:
an integrated-circuit die including a die backside surface;
a first thermal interface material (TIM1) on the die backside surface;
an integrated heat spreader contacting the TIM1 at a TIM1 interface, wherein the integrated heat spreader includes:
a basin form factor at a heat-sink interface that is opposite the TIM1 interface;
a primary thermal-interface material (primary TIM2) in the basin form factor; and
a containment form factor secondary thermal-interface material (secondary TIM2) at a perimeter of the basin form factor, wherein the primary TIM2 fills and contacts secondary TIM2, wherein the secondary thermal-interface material is a thermal adhesive.

11. The integrated-circuit device package of claim 10, further including:
a heat sink on the secondary TIM2 and in contact with the primary TIM2.

12. The integrated-circuit device package of claim 10, wherein the basin form factor includes:
a basin floor opposite the TIM1 interface;
a basin sidewall;
a basin shoulder wherein the basin sidewall connects the basin floor to the basin shoulder at an inflection point at the basin floor and the sidewall;
wherein the containment form factor secondary thermal-interface material contacts the basin shoulder;
wherein the primary thermal-interface material in the basin form factor is a thermal grease, and wherein the secondary thermal-interface material is a thermal adhesive; and
wherein the primary thermal-interface material fills from the basin floor to the secondary thermal-interface material at a thermal-adhesive top surface above the basin shoulder.

13. The integrated-circuit device package of claim 10, wherein the basin form factor includes:
a basin floor opposite the TIM1 interface;
a basin sidewall;
a basin shoulder wherein the basin sidewall connects the basin floor to the basin shoulder at an inflection point at the basin floor and the sidewall;
wherein the containment form factor secondary thermal-interface material contacts the basin shoulder;
wherein the primary thermal-interface material in the basin form factor is a thermal grease, and wherein the secondary thermal-interface material is a thermal adhesive;
wherein the primary thermal-interface material fills from the basin floor to the secondary thermal-interface material at a thermal-adhesive top surface above the basin shoulder; and
a heat sink on the secondary TIM2 and in contact with the primary TIM2.

14. The integrated-circuit device package of claim 10, further including:
a board on the basin form-factor integrated heat spreader;
wherein the integrated-circuit die is a first IC die;
a chipset on the board; and
a memory die on the board.

15. The integrated-circuit device package of claim 10, further including:
a printed wiring board on the basin form-factor integrated heat spreader;
wherein the integrated-circuit die is a first IC die;
a chipset on the printed wiring board;
a memory die on the printed wiring; and
an external shell that is an integral portion of a printed wiring board.

16. A process of assembling an integrated heat sink, comprising:
placing a cavity of an integrated heat spreader over a backside of a die, the integrated heat spreader including a basin form factor on a side of the integrated heat spreader opposite the die; and
containing a primary thermal-interface material in the basin form factor on the integrated heat spreader, by a containment form-factor secondary thermal-interface material at a perimeter of the integrated heat sink.

17. The process of claim 16, further including applying a heat sink to the primary and secondary thermal-interface materials (primary TIM2 and secondary TIM2).

18. The process of claim 16, further including:
applying a heat sink to the primary and secondary thermal-interface materials (primary TIM2 and secondary TIM2); and
curing the primary TIM2 and secondary TIM2 to form a TIM2.

19. The process of claim 16, further including:
applying a heat sink to the primary and secondary thermal-interface materials (primary TIM2 and secondary TIM2);
curing the primary TIM2 and secondary TIM2 to form a TIM2; and
seating the basin form-factor integrated heat spreader on an integrated-circuit package substrate, to bond a first thermal interface material (TIM1) at a die backside surface of an integrated-circuit die.

* * * * *